United States Patent
Fujii et al.

(10) Patent No.: US 6,791,061 B2
(45) Date of Patent: Sep. 14, 2004

(54) OPTICAL MACHINING DEVICE

(75) Inventors: Koji Fujii, Osaka (JP); Kazushige Hirasawa, Hyogo (JP); Dokei Nagayasu, Hyogo (JP); Makoto Ryudo, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 9 days.

(21) Appl. No.: 10/169,480

(22) PCT Filed: Nov. 6, 2001

(86) PCT No.: PCT/JP01/09697
§ 371 (c)(1),
(2), (4) Date: Nov. 25, 2002

(87) PCT Pub. No.: WO02/38324
PCT Pub. Date: May 16, 2002

(65) Prior Publication Data
US 2003/0132210 A1 Jul. 17, 2003

(30) Foreign Application Priority Data
Nov. 7, 2000 (JP) .................................... 2000-338633

(51) Int. Cl.[7] .......................... B23K 26/14; B23K 26/26
(52) U.S. Cl. .......................... 219/121.75; 219/121.84
(58) Field of Search ........... 219/121.6, 121.63–121.72, 219/121.75, 121.83–121.86

(56) References Cited

U.S. PATENT DOCUMENTS 3,696,230 A * 10/1972 Friedrich ............... 219/121.75
5,660,748 A * 8/1997 Tanaka et al. ......... 219/121.84
5,756,962 A     5/1998 James et al.
5,898,522 A * 4/1999 Herpst .................... 359/511

FOREIGN PATENT DOCUMENTS

| CN | 2108601 U | 7/1992 |
|---|---|---|
| CN | 1123209 A | 5/1996 |
| JP | 356102392 A * | 8/1981 |
| JP | 61-216380 | 9/1986 |
| JP | 2001030199 A * | 2/2001 |
| JP | 2001-358397 | 12/2001 |

* cited by examiner

Primary Examiner—Samuel M. Heinrich
(74) Attorney, Agent, or Firm—McDermott Will & Emery LLP

(57) ABSTRACT

An optical processing apparatus has high reliability and stable welding quality. In the processing apparatus, a semiconductor laser and an optical system are disposed to a flow path of processing gas. The gas protects the semiconductor laser and the optical system from moisture and dust while cooling them. In addition, the apparatus also leads the processing gas to flow through a holder of the optical system to increase cooling effect for the optical system and to improve an optical accuracy. The apparatus guides the processing gas along a surface of a cover glass inside a nozzle ejecting the processing gas to a workpiece, to prevent the surface of the cover glass from being damaged and stained. The processing gas is ejected in a direction coaxial with a direction of output light, so as to shield an area being processed.

9 Claims, 1 Drawing Sheet

US 6,791,061 B2

OPTICAL MACHINING DEVICE

TECHNICAL FIELD

The present invention relates to an optical processing apparatus that processes a workpiece with laser.

BACKGROUND ART

A conventional optical processing apparatus shown in FIG. 2 converges light emitted by semiconductor laser 101 which converts electrical energy into optical energy (electric circuit is not illustrated here), and irradiates the light to workpiece 111. In an optical processing apparatus used for manufacturing processes, radiating faceplate 102 of semiconductor laser 101 and a group of lenses 105 that compose an optical convergence system are provided on their surfaces with special surface treatment for antireflection of the light in order to effectively use the optical energy generated. Respective surfaces of radiating faceplate 102 of the semiconductor laser 101 and the group of lenses 105 are damaged if getting wet with waterdrops due to, e.g., dew formation, thereby preventing the apparatus from producing a sufficient output.

To prevent such a problem, the conventional processing apparatus is equipped with desiccant 113 within hermetically-sealed interior space 103 accommodating the semiconductor laser 101 and the group of lenses 105. Desiccant 113 prevents contaminant such as waterdrops from adhering to the surface of radiating faceplate 102 of the semiconductor laser 101.

Shielding gas 110 needs to be supplied into in-process area 112 of workpiece III to protect it from surrounding air when the converged light is used for processing such as welding. For this reason, shielding gas 110 is supplied usually with side nozzle 108 mounted to a position at an angle different from that of the optical processing apparatus.

Semiconductor laser 101 and the group of lenses 105 represent major heat-generating elements. For the semiconductor laser 101, in particular, a water-cooling structure is mainly used, while thermo-electric cooling system using the Peltier effect may be employed as another method in certain instances. In the group of lenses 105, if a large temperature change occurs during the processing in enclosure 104 holding the lenses, the change influences positional accuracy as well as optical accuracy of the group of lenses 105 for converging the light, thus causing a change in the convergent characteristic, that is, performance of the processing. A processing apparatus may include a part of group of lenses 105 water-cooled for this reason.

The group of lenses 105 is provided with cover glass 107 for protecting them from contaminant gases such as fumes, emanating particles such as dust generated during the processing from in-process area 112 of the workpiece 111.

The conventional optical processing apparatus has a complex structure to accommodate the semiconductor laser 101 and the group of lenses 105, since employing the conventional method of preventing moisture and dust, which requires an increase in hermeticity of interior space 103. The processing apparatus also requires a complicated procedure to handle, as it needs periodical change of the desiccant 113.

Moreover, a vortex of surrounding air, which may result in improper shielding of the in-process area 112, may be generated depending on mounting angle θ of side nozzle 108 for supplying shielding gas 110 to protect in-process area 112 of the workpiece 111 from the surrounding air, a distance d from in-process area 112, and inclination angle γ of side nozzle 108 with respect to direction X of the processing.

The optical processing apparatus is provided with a water-cooling structure mainly for the semiconductor laser 101, in order to reduce temperature during the processing. Even with other cooling methods, a temperature gradient may increase between a cooled end and a heat source within the semiconductor laser 101 if a temperature of interior space 103 rises, which leads to an increase in temperature of the heat source, i.e. a light-generating section. This affects an operational life of the semiconductor laser 101.

In addition, it is difficult to cool the entire group of lenses 105 due to problems relative to water-cooling of the group of lenses 105, such as difficulty in ensuring water-tightness, complexity of the structure, increase in processing cost associated with these problems. Accordingly, there has been a limitation in maintaining the processing performance stable. Furthermore, cover glass 107 is liable to being stained quickly as being exposed directly to contaminant gas and emanating particles. This requires cover glass 107 to be replaced promptly in order to be prevented from degradation of the processing performance, thereby giving rise to a problem in work-hours and cost.

DISCLOSURE OF THE INVENTION

An optical processing apparatus which is easily handled and has an outstanding processing performance is provided.

The optical processing apparatus includes a laser source, an enclosure which accommodates the laser source and having an inlet opening for introducing gas and an outlet opening for discharging the gas, a lens disposed to a path of laser irradiated from the laser source, a lens holder for supporting the lens, and a cylinder covering an exterior of the lens holder to form a space with the lens holder for guiding the gas to flow through the space.

DESCRIPTION OF THE PREFERRED EMBODIMENT

Figure 1:
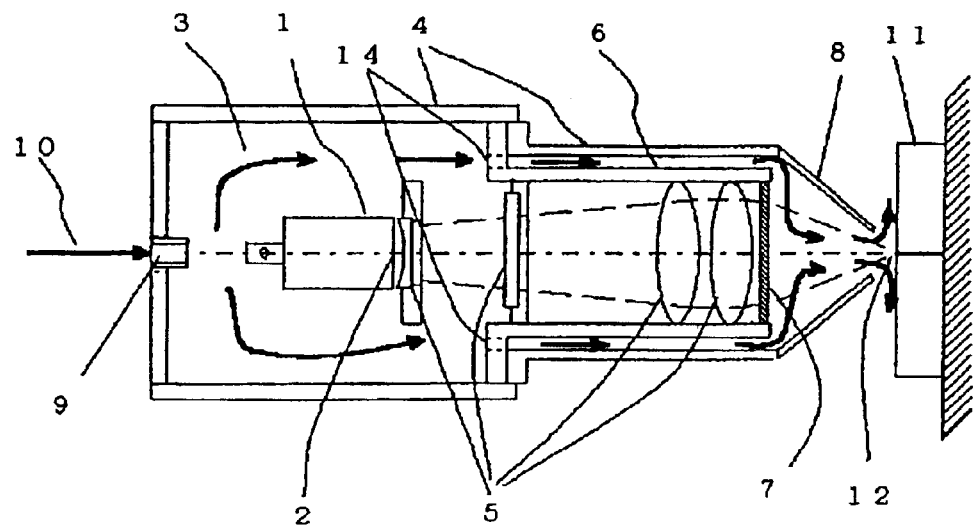
FIG. 1 is a sectional view depicting an internal structure of an optical processing apparatus according to an exemplary embodiment of the present invention.
Figure 2:
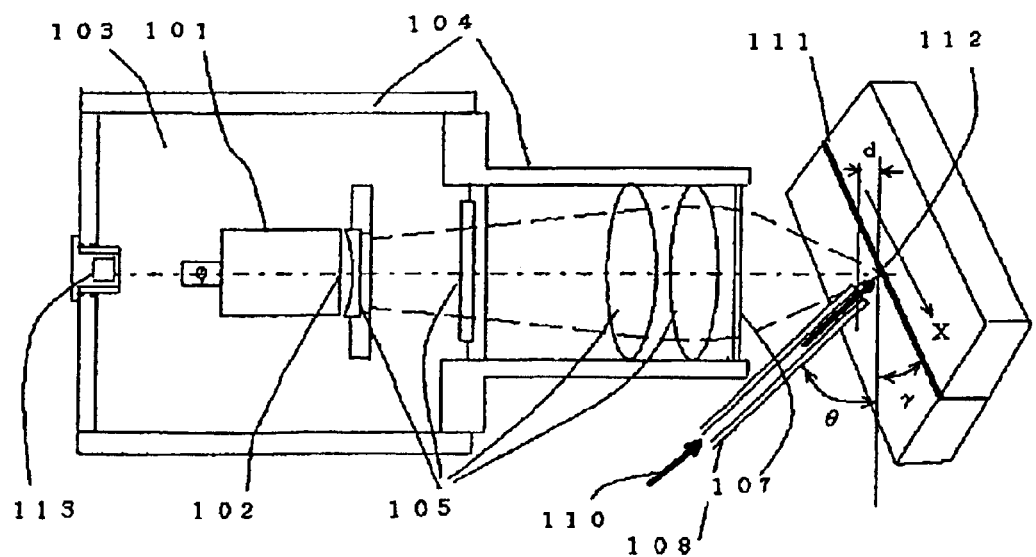
FIG. 2 is a sectional view of the principal portion of a conventional optical processing apparatus, illustrating its internal structure and a state of processing.

An optical processing apparatus according to an exemplary embodiment of the present will be described referring to FIG. 1. For processing, the optical processing apparatus uses shielding gas 10 of argon and/or nitrogen as principal component for welding. Gas 10 introduced from gas inlet 9, which serves as a gas intake opening, enters interior space 3, and passes by water-cooled semiconductor laser 1, i.e. a laser source, and an optical system in the vicinity of it. Then, gas 10 passes through slit 14 serving as a gas outlet opening provided around lens holder 6 flows through a space formed between enclosure 4 and the lens holder 6. The gas is then discharged to outside after being rectified with nozzle 8 in such a manner that it envelops an area under the processing on workpiece 11.

Gas 10 is purified to maintain its dry condition in interior space 3, and to gain effectiveness of dust prevention. Gas 10 removes heat generated in semiconductor laser 1 and the nearby optical system. The air-cooling function further improves the cooling effect as compared with an apparatus including semiconductor laser 1 cooled only by water. In addition, the air-cooling function of gas 10 suppresses temperature rise of lens holder 6 as flowing through periphery of lens holder 6, and maintains accuracy of the optical system. Nozzle 8 changes a course of flowing gas 10 of which part flows along a surface of cover glass 7, and thus protects surfaces of lenses from contaminant gases such as fumes, emanating particles such as dust produced around in-process area 12. Accordingly, gas 10 prevents the contaminant gases and the emanating particles from reaching the surface of cover glass 7, and avoids the surface of the glass from being stained, thereby maintaining steadiness of the processing performance of the apparatus.

Gas 10 is ejected from nozzle 8 and blasted upon the workpiece 11 along a direction coaxial with the laser converged and irradiated by the group of lenses 5, thereby uniformly shielding in-process area 12. This provides the apparatus with perpetual shielding effect with little influence of a direction, distance in processing.

INDUSTRIAL APPLICABILITY

An optical processing apparatus according to the present invention has an improved moisture-proofing capability as well as dust-proofing capability, and thereby having an improved reliability, since including a semiconductor laser and a neighboring optical system operating in clean gas environment inside the optical processing apparatus. The gas is also used to air-cool heat generated by the semiconductor laser and the neighboring optical system, so as to provide the apparatus with a longer operational life than an apparatus employing only a water-cooling method.

The optical processing apparatus according to the invention since including an air-cooled optical system, has accuracy of the optical system, and stabilize a processing performance.

The optical processing apparatus according to the invention prevents contaminant gases and emanating particles generated in an in-process area from reaching a surface of the optical processing apparatus, thereby reducing working time and cost needed for the maintenance.

In addition, the in-process area, since being shielded with processing gas, is processed at a high quality.

What is claimed is:

1. An optical processing apparatus comprising:
    a laser source for generating laser light;
    an enclosure accommodating said laser source therein, and having an inlet opening for introducing gas and an outlet opening for discharging said introduced gas, said laser source being positioned in an interior space of the enclosure extending from the inlet opening to the outlet opening such that gas introduced from the inlet opening passes by the laser source;
    a lens, disposed in a path of laser light irradiated from said laser source through said enclosure;
    a lens holder for supporting said lens; and
    a cylinder fluidly communicating with the outlet opening of said enclosure, for covering an outer periphery of said lens holder to form a space with said lens holder for guiding said discharged gas to flow therethrough.

2. An optical processing apparatus according to claim 1, further comprising a nozzle connected to a laser light irradiating portion of said cylinder, said nozzle including a tip end having a diameter smaller than a diameter of said irradiating portion, wherein said gas guided through said space flows into said nozzle.

3. An optical processing apparatus according to claim 2, wherein said nozzle has a shape that leads said gas to flow along said irradiating portion of said cylinder.

4. An optical processing apparatus according to claim 2, wherein said gas flows from said nozzle in the same direction as an irradiating direction of said laser light.

5. An optical processing apparatus according to any one of claims 2 to 4, wherein said lens holder and said cylinder have a cylindrical shape, and wherein said nozzle has a conic shape with an opening in said tip end through which laser light irradiates, and covers said irradiating portion of said cylinder.

6. An optical processing apparatus according to any one of claims 1 to 4, wherein said gas is shielding gas for welding.

7. An optical processing apparatus according to claim 3, wherein said gas flows from said nozzle in the same direction as an irradiating direction of said laser light.

8. An optical processing apparatus according to claim 7, wherein said lens holder and said cylinder have a cylindrical shape, and wherein said nozzle has a conic shape with an opening in said tip end through which laser light irradiates, and covers said irradiating portion of said cylinder.

9. An optical processing apparatus according to claim 5, wherein said gas is shielding gas for welding.

* * * * *